(12) United States Patent
Renault

(10) Patent No.: US 11,283,293 B2
(45) Date of Patent: Mar. 22, 2022

(54) APPARATUS FOR MONITORING A CURRENT-CARRYING DEVICE

(71) Applicant: SDA-ENGINEERING GMBH, Herzogenrath (DE)

(72) Inventor: Philippe L. A. Renault, Jülich (DE)

(73) Assignee: SDA-ENGINEERING GMBH, Herzogenrath (DE)

( * ) Notice: Subject to any disclaimer, the term of this patent is extended or adjusted under 35 U.S.C. 154(b) by 367 days.

(21) Appl. No.: 16/209,492

(22) Filed: Dec. 4, 2018

(65) Prior Publication Data
US 2019/0178908 A1    Jun. 13, 2019

(30) Foreign Application Priority Data
Dec. 13, 2017 (DE) .................. 10 2017 129 758.8

(51) Int. Cl.
*H02J 50/00*    (2016.01)
*H02J 13/00*    (2006.01)
(Continued)

(52) U.S. Cl.
CPC .......... *H02J 13/00034* (2020.01); *G01P 1/04* (2013.01); *G01P 1/127* (2013.01);
(Continued)

(58) Field of Classification Search
CPC ................................. G01P 15/11; H02J 50/10
(Continued)

(56) References Cited

U.S. PATENT DOCUMENTS 10,535,965 B1 * 1/2020 Sultenfuss ............ H01R 13/15
2010/0084920 A1 * 4/2010 Banting ............ G01R 19/2513
307/66
(Continued)

FOREIGN PATENT DOCUMENTS

CN    103326468 B    6/2016
CN    107749672 A    3/2018
(Continued)

OTHER PUBLICATIONS

European Patent Office (EPO), Extended Search Report for European Patent Application EP 18 20 6994, dated May 17, 2019 (8 pages).

*Primary Examiner* — Suchin Parihar
(74) *Attorney, Agent, or Firm* — Pauley Erickson & Swanson

(57) ABSTRACT

An apparatus and use of the apparatus for monitoring a current-carrying device wherein at least one acceleration sensor produces acceleration measurement values and a communication device transmits produced acceleration measurement values. A power supply unit is for the acceleration sensor and the communication device. The power supply unit includes an induction plate of a metallic material and a conductor loop extending around the induction plate and produces a power supply for the acceleration sensor and the communication device exclusively through induction from an electromagnetic alternating field of the current-carrying device. The apparatus can be positioned in a closed housing having a housing wall and the induction plate can be at least a subregion of the housing wall.

18 Claims, 1 Drawing Sheet

(51) Int. Cl.
- *H02J 50/10* (2016.01)
- *H01F 38/14* (2006.01)
- *H04B 5/00* (2006.01)
- *G01P 1/04* (2006.01)
- *G01P 1/12* (2006.01)
- *G01P 15/11* (2006.01)
- *G01R 31/50* (2020.01)

(52) U.S. Cl.
CPC ............. *G01P 15/11* (2013.01); *H01F 38/14* (2013.01); *H02J 50/10* (2016.02); *H04B 5/0037* (2013.01); *G01R 31/50* (2020.01)

(58) Field of Classification Search
USPC ........................................................ 320/107
See application file for complete search history.

(56) References Cited

U.S. PATENT DOCUMENTS

| | | | | |
|---|---|---|---|---|
| 2013/0096825 | A1* | 4/2013 | Mohanty | G01P 15/097 |
| | | | | 701/472 |
| 2013/0329331 | A1* | 12/2013 | Erger | H01H 71/04 |
| | | | | 361/102 |
| 2014/0266240 | A1* | 9/2014 | Haensgen | H02J 50/001 |
| | | | | 324/537 |
| 2015/0326136 | A1* | 11/2015 | Strzalkowski | H02M 5/293 |
| | | | | 323/355 |
| 2016/0126752 | A1* | 5/2016 | Vuori | H02J 50/80 |
| | | | | 307/104 |
| 2017/0085096 | A1* | 3/2017 | Hong | H02J 50/12 |
| 2017/0086281 | A1* | 3/2017 | Avrahamy | H05B 39/088 |
| 2017/0133134 | A1* | 5/2017 | Pohl | H04B 5/0037 |
| 2019/0044381 | A1* | 2/2019 | Valtysson | H02M 1/44 |

FOREIGN PATENT DOCUMENTS

| | | |
|---|---|---|
| DE | 689 20 198 T2 | 5/1995 |
| DE | 10 2011 003 308 A1 | 8/2012 |
| WO | WO 2010/136052 A1 | 12/2010 |
| WO | WO 2017/035548 A1 | 3/2017 |

* cited by examiner

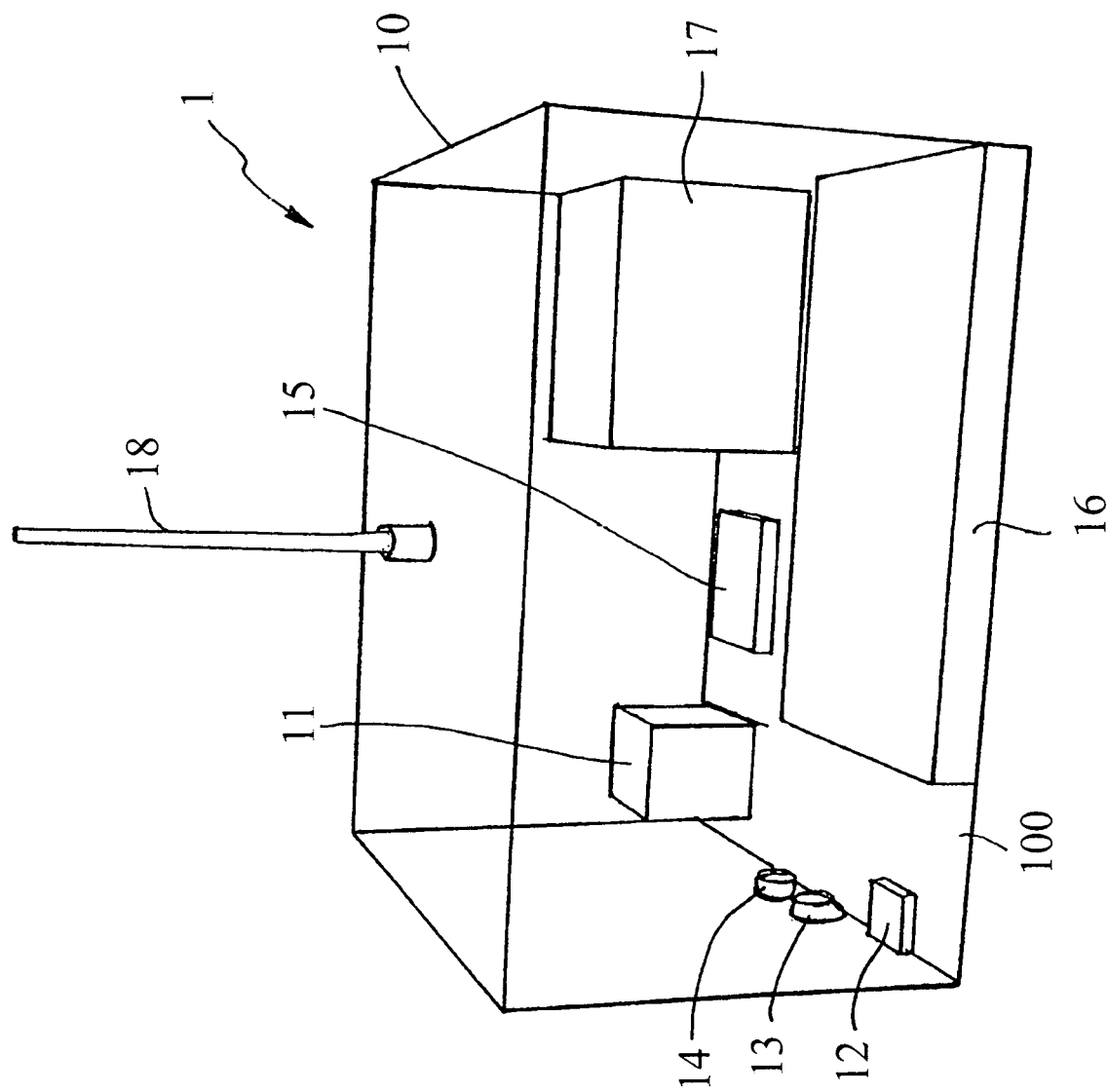

APPARATUS FOR MONITORING A CURRENT-CARRYING DEVICE

BACKGROUND OF THE INVENTION

Field of the Invention

This invention relates to an apparatus for monitoring a current-carrying device, having at least one acceleration sensor for producing acceleration measurement values, a communication device for transmitting the produced acceleration measurement values, and a power supply unit for the at least one acceleration sensor and communication device.

Discussion of Related Art

Often, speed or acceleration measurement sensors are used to measure seismically or dynamically induced movements. It is thus possible, for example, to monitor a current-carrying device such as a transformer in a substation and when a predeterminable measured threshold of acceleration measurement values is reached, to transmit an alarm via the communication device to a remote control center in order, for example with the occurrence of tremors, to trigger an automatic shut-down of the monitored current-carrying device. This is required, for example, in regions with a high risk of earthquakes.

Chinese Patent Reference CN 1 03 326 468 B discloses a monitoring device of this generic type for a power supply grid composed of transmission lines, having a plurality of sensors for environmental influences and communication devices, which are supplied with an operating voltage inductively by a charging coil on the transmission line. Mounting charging coils on the transmission line requires a corresponding accessibility of the transmission line and requires a large amount of installation work, which also requires the temporary shut-down of the current-carrying device during installation, for safety reasons. This device could use some improvement.

German Patent Reference DE 689 20 198 T2 discloses an abnormality diagnosing system for a high-voltage power apparatus, having an acceleration sensor for producing acceleration measurement values and a communication device for transmitting the produced acceleration measurement values, which are powered by a power supply unit. This system requires an electrical connection to the corresponding installation work.

Chinese Patent Reference CN 1 07 749 672 A discloses a system for converting energy from a high-frequency alternating field by an induction plate and a conductor loop.

PCT Patent Reference WO 2010/136 052 A1 discloses an electrotechnical consumer, which captures energy from the stray field of an electric motor.

SUMMARY OF THE INVENTION

One object of this invention is to provide an apparatus of the type mentioned above but which can be installed in the simplest way and can be operated in a fully autonomous way.

To attain this object and others, the present invention provides an apparatus for monitoring a current-carrying device according to the features described in this specification and in the claims.

Advantageous embodiments and modifications of this invention are discussed in the claims.

This invention provides for a power supply unit to include an induction plate including a metallic material and a conductor loop extending around the induction plate, by which it is possible to produce the power supply for the at least one acceleration sensor and communication device and possibly other components of the apparatus according to this invention, exclusively through induction from an electromagnetic alternating field of the current-carrying device and the apparatus is positioned in a closed housing with a housing wall, where the induction plate includes at least a subregion of the housing wall.

According to this invention, it is possible for the entire apparatus, as a compact unit contained in a closed housing, to be positioned close to the current-carrying device to be monitored, for example a transformer of a substation, and based on the existing electromagnetic alternating field surrounding the current-carrying device, the apparatus produces the electrical energy required for operation directly from the alternating field. According to this invention, there is no need to provide additional wiring of the apparatus with supply lines for the operating voltage and/or to set up additional energy sources, such as a photovoltaic system. It is sufficient to place the apparatus within the effective range of the electromagnetic alternating field of the current-carrying device to be monitored, and the apparatus starts producing the required energy automatically and in an entirely autonomous fashion and commences operation for monitoring the current-carrying device.

The apparatus according to this invention can be very compactly designed and has components that require only extremely small amounts of power in order to use the operating current, which is captured via the electromagnetic induction, in the most efficient possible way and without interruption.

Because of its ability to supply itself with power from electromagnetic fields in its immediate vicinity, the apparatus according to this invention is suitable for use in any place that lacks an external power source and/or where cables cannot be laid.

According to one embodiment of this invention, the conductor loop is simply arranged so that it extends around the induction plate and the conductor loop should generally be embodied as having open ends at which the operating voltage for the components of the apparatus can be tapped. The induction plate amplifies the magnetic flux and allows the induction into the conductor loop, which is simply routed in a large loop.

According to another embodiment of this invention, the conductor loop is based on a silver or copper conductor.

According to another embodiment of this invention, a total of three acceleration sensors are provided, which are positioned spatially orthogonal relative to one another in order to be able to equally detect and evaluate accelerations in all three directions in space.

To further increase operational reliability, according to another embodiment of this invention, the power supply unit of the apparatus according to this invention can also have a buffer battery with an associated charging regulator, which is likewise inductively charged by the induction plate and the conductor loop extending around it. The buffer battery is primarily used for a short-term bridging and for a voltage stabilization.

In order to archive the acceleration measurement values acquired by the acceleration sensors and to be able to selectively read them out only in certain time intervals or to store them in a cache for a subsequent transmission, according to another embodiment of this invention, a data memory is provided for storing the acceleration measurement values. Such a data memory can, for example, be embodied in a form of a conventional memory card.

Depending on the situation, the communication device of the apparatus according to this invention can have interfaces for a wired and/or a wireless communication. For example, in order to produce an external wired data connection, RJ 45 sockets or also a USB connection can be provided, while for a wireless communication, for example a GPRS/LTE mobile phone unit or a WLAN transmitter with a corresponding antenna can be provided on the apparatus. In particular, the communication can take place wirelessly via the LTE narrow band in an extremely energy-saving way and with very good network coverage as well as a high signal level in order to better enable a communication even through reinforced concrete walls and ceilings and from basement rooms and the like.

For the minimum possible space requirement and low energy consumption, the acceleration sensors are preferably of the MEMS types that are also integrated into smartphones and that have an extremely low power consumption of only a few mA and an operating voltage of ≤5 V.

BRIEF DESCRIPTION OF THE DRAWING

Some embodiments and details of this invention are explained in view of an exemplary embodiment shown in the drawing.

The FIGURE is a schematic depiction of an apparatus which can be used, for example, to monitor a current-carrying device in a form of a transformer that produces a powerful electromagnetic alternating field in its immediate vicinity and the apparatus can be placed in this immediate vicinity so that it lies within the influence range of this alternating field.

DETAILED DESCRIPTION OF THE INVENTION

The apparatus 1 has a housing 10 that is closed on all sides, with housing walls 100 within which the components described below are protected from environmental influences.

The apparatus 1 includes three acceleration sensors 11 positioned in an orthogonal relationship with respect to one another, which, as sensing elements, register dynamically or seismically induced movements such as tremors in all three directions in space and generate corresponding acceleration measurement values.

The apparatus 1 also includes a data memory 12 in the form of a conventional memory card and a connection socket 13 for connecting communication lines as well as a GPRS/LTE module as a communication device 15 for wirelessly transmitting the acceleration measurement values detected by the acceleration sensors 11 via an antenna 18. Both the wired connection socket 13 and the wireless communication via the GPRS/LTE module of the communication device 15 and the antenna 18 are carried out with a remotely located monitoring device, which evaluates the measurement values of the acceleration sensors 11 and, for example, when a tremor occurs, triggers an automatic shutdown of the current-carrying device being monitored.

In order to operate the acceleration sensors 11 and the other components of the apparatus contained inside the housing 10, such as the GPRS/LTE module 15, the data memory 12, and the buffer battery 17 that will be explained in greater detail below, an induction plate 16 comprising a metallic material is provided, around which an electrical conductor in the form of a silver or copper wire is laid in a large loop. The induction plate 16 is part of the housing wall 11, which is located in the bottom region in the depiction according to FIG. 1.

As soon as the housing 1 comes into the effective range of the electromagnetic alternating field of the current-carrying device to be monitored, for example by being placed near or in its immediate vicinity, through induction from the alternating field into the conductor loop surrounding the induction plate 16, a fully autonomous production of the required for the operation of the apparatus 1 and above-described components occurs. In this case, by induction from the alternating field, the conductor loop supplies not only the acceleration sensors 11, the communication device 15, and the data memory 12 with the necessary operating voltage, but also, by a corresponding charging regulator that is not shown separately here, charges a buffer battery 17 that bridges over short-term outages of the inductive power supply and stabilizes the voltage supplied by the conductor loop.

Naturally, instead of the wireless transmission of measurement values, a wired transmission can also take place by a connection to the socket 13 provided for this purpose.

Also, if an external power supply is available, the necessary operating voltage can also be supplied via a corresponding connection socket 14, bypassing the inductive energy capture.

Because of the above-described ability of the apparatus 1 to produce the necessary operating voltage automatically by induction from the electromagnetic alternating field that is present in the vicinity of or near the current-carrying device that is to be monitored, however, the apparatus 1 does not normally need an external power supply.

All that is needed is to place the apparatus 1, which is contained in a compact housing 10, in the vicinity of or near the current-carrying device to be monitored, and it immediately commences operation. The installation work is thus reduced to an absolute minimum.

In addition to monitoring a transformer, it is also possible to monitor any other current-carrying devices in the form of subassemblies and line sections that have a sufficiently large and/or powerful current flowing through them and produce a corresponding alternating field.

German Patent Application DE 10 2017 129 758.8, filed 13 Dec. 2017, the priority document corresponding to this invention, to which a foreign priority benefit is claimed under Title 35, United States Code, Section 119, and its entire teachings are incorporated, by reference, into this specification.

What is claimed is:

1. An apparatus for monitoring a current-carrying device, the apparatus comprising: at least one acceleration sensor (11) producing acceleration measurement values, a communication device (15) transmitting produced acceleration measurement values, and a power supply unit for the at least one acceleration sensor (11) and the communication device (15), the power supply unit including an induction plate (16) of a metallic material and a conductor loop extending around the induction plate (16) to produce a power supply for the at least one acceleration sensor (11) and the communication device (15) exclusively through induction from an electromagnetic alternating field of the current-carrying device without any additional energy source and the apparatus (1) positioned in a closed housing (10) having a housing wall (100), and the induction plate (16) being at least a subregion of the housing wall (100).

2. The apparatus according to claim 1, wherein the conductor loop is arranged to extend around the induction plate (16).

3. The apparatus according to claim 2, wherein the conductor loop is silver-based or copper-based.

4. The apparatus according to claim 3, wherein three acceleration sensors (11) are positioned orthogonal with respect to one another in space.

5. The apparatus according to claim 4, wherein the power supply unit comprises a buffer battery (17) with a charging regulator.

6. The apparatus according to claim 5, wherein a data memory (12) stores the acceleration measurement values.

7. The apparatus according to claim 6, wherein the communication device (15) has interfaces (13, 18) for a wired and/or a wireless communication.

8. A use of the apparatus (1) according to claim 7, for monitoring the current-carrying device embodied as a transformer.

9. A use of the apparatus (1) according to claim 1, for monitoring the current-carrying device embodied as a transformer.

10. The apparatus according to claim 1, wherein the conductor loop is silver-based or copper-based.

11. The apparatus according to claim 1, wherein three acceleration sensors (11) are positioned orthogonal with respect to one another in space.

12. The apparatus according to claim 1, wherein the power supply unit comprises a buffer battery (17) with a charging regulator.

13. The apparatus according to claim 1, wherein a data memory (12) stores the acceleration measurement values.

14. The apparatus according to claim 1, wherein the communication device (15) has interfaces (13, 18) for a wired and/or a wireless communication.

15. The apparatus according to claim 1, wherein the apparatus is configured to produce the power supply without a wired connection to a current of the current-carrying device.

16. The apparatus according to claim 1, wherein the induction plate (16) and the conductor loop are fully positioned within the closed housing (10).

17. The apparatus according to claim 16, wherein power supply unit is configured to produce the power supply without a wired connection to a current of the current-carrying device.

18. An apparatus for monitoring a current-carrying device, the apparatus comprising: a closed housing (10) having a housing wall (100), the closed housing (10) enclosing: at least one acceleration sensor (11) producing acceleration measurement values; a communication device (15) transmitting produced acceleration measurement values; and a power supply unit for the at least one acceleration sensor (11) and the communication device (15), the enclosed power supply unit including an induction plate (16) of a metallic material and a conductor loop extending around the induction plate (16) to produce a power supply for the at least one acceleration sensor (11) and the communication device (15) exclusively through induction from an electromagnetic alternating field of the current-carrying device without any additional energy source, wherein the induction plate (16) and conductor loop are enclosed in the closed housing (10) as being at least a subregion of the housing wall (100).

* * * * *